(12) United States Patent
Chang et al.

(10) Patent No.: US 7,097,945 B2
(45) Date of Patent: Aug. 29, 2006

(54) METHOD OF REDUCING CRITICAL DIMENSION BIAS OF DENSE PATTERN AND ISOLATION PATTERN

(75) Inventors: Ching-Yu Chang, Yilan Hsien (TW); Hsin-huei Chen, Miaoli (TW); Meng-Wei Chen, Changhua (TW)

(73) Assignee: MACRONIX International Co., Ltd., Hsinchu (TW)

( * ) Notice: Subject to any disclaimer, the term of this patent is extended or adjusted under 35 U.S.C. 154(b) by 211 days.

(21) Appl. No.: 10/249,559

(22) Filed: Apr. 18, 2003

(65) Prior Publication Data

US 2005/0009341 A1    Jan. 13, 2005

(51) Int. Cl.
*G03F 1/00* (2006.01)
*H01L 21/302* (2006.01)

(52) U.S. Cl. .......................... 430/5; 438/714; 438/725; 216/41

(58) Field of Classification Search .................. 430/5; 438/714, 725; 216/41
See application file for complete search history.

(56) References Cited

U.S. PATENT DOCUMENTS 6,197,452 B1 * 3/2001 Matumoto .................... 430/5
6,361,911 B1 * 3/2002 Tsai et al. .................... 430/30
6,538,719 B1 * 3/2003 Takahashi et al. ............ 355/53
6,929,887 B1 * 8/2005 Lin et al. ...................... 430/5

FOREIGN PATENT DOCUMENTS

| CN | 1211813 A | | 3/1999 |
| JP | 01-246834 | * | 10/1989 |
| JP | 2000-195787 | * | 7/2000 |
| JP | 2001-222097 | * | 8/2001 |

* cited by examiner

*Primary Examiner*—George A. Goudreau
(74) *Attorney, Agent, or Firm*—Jianq Chyun IP Office

(57) ABSTRACT

A method of reducing a critical dimension ("CD") bias between a dense pattern and an isolation pattern is disclosed. The method includes a first step of providing a mask having a dense pattern, an isolation pattern and the other area of the mask is transparent, in which mask the dense pattern has a first opaque pattern and the isolation pattern has a second opaque pattern. The second step of the method is forming a virtual pattern around the isolation pattern, in which a distance between the virtual pattern and the isolation pattern is y, and the virtual pattern has a pattern line width x. By forming the virtual pattern around the isolation pattern, the flare effect of the isolation pattern is close to that of the dense pattern, thus the CD bias between a dense pattern, and an isolation pattern is reduced, and the process window does not shrink.

4 Claims, 2 Drawing Sheets

METHOD OF REDUCING CRITICAL DIMENSION BIAS OF DENSE PATTERN AND ISOLATION PATTERN

BACKGROUND OF INVENTION

1. Field of the Invention

The present invention generally relates to a photolithography process. More particularly, the present invention relates to a method of reducing a critical dimension ("CD") bias between a dense pattern and an isolation pattern on a chip.

2. Description of the Related Art

In the design of a semiconductor device, the integration of a circuit device grows up rapidly and the dimension of the whole circuit device reduces rapidly. The most important process of confining the dimension of the whole semiconductor process is the photolithography process. For example, in a device structure related to a metal oxide semiconductor ("MOS"), such as a pattern of film layer or an area having dopants, the dimension is confined by the photolithography process. In addition, whether the line width of the device, and so integration of the whole semiconductor process, may or may not be less than 0.18 µm, is dependent on the development of the photolithography process.

In general, the area of a mask may be separated into at least a portion of isolated pattern, and another portion of dense pattern. For example, in a system on a chip ("SOC") process of manufacturing a logic circuit and a memory cell, such as a read only memory, a static random access memory, a flash memory or a dynamic random access memory on the same chip, the logic circuit relates to an isolation pattern and the memory cell relates to a dense pattern in general. However, when an exposure process is used for transferring the isolation pattern and the dense pattern to a photoresist layer, a CD bias between a dense pattern and an isolation pattern is produced by a flare effect, and the efficiency of the manufactured device is reduced.

A conventional method of resolving the flare effect is an optical proximity correction ("OPC") method, which method relates to decrease or increase of the line width of the original pattern, in order to have the same line width in the transferred isolation pattern and the transferred dense pattern. However, because of the flare effects produced by different exposure apparatus are different from each other, each original pattern may have different correction parameters on different exposure apparatus. Moreover, the process windows between an isolated pattern and a dense pattern for a corrected pattern are different, and the flare effect is also dependent on the pattern density. Thus the OPC method can not resolve the CD bias and the difference of the process window produced by the flare effect.

SUMMARY OF INVENTION

Accordingly, the purpose of the present invention is to provide a method of reducing a CD bias between a dense pattern and an isolation pattern, for reducing the CD bias between the dense pattern and the isolation pattern produced by a flare effect.

It is another object of the present invention to provide a method of reducing a CD bias between a dense pattern and an isolation pattern, for reducing the CD bias between the dense pattern and the isolation pattern caused by a flare effect without reducing the same process windows of the dense pattern and the isolation pattern.

In order to achieve the above objects and other advantages of the present invention, a method of reducing a CD bias between a dense pattern and an isolation pattern is provided. The method includes a first step of providing a mask, in which a portion of the mask has a dense pattern and another portion of the mask has an isolation pattern. The dense pattern has a first opaque pattern and the isolation pattern has a second opaque pattern, and other portion of the mask is transparent. A second step is that of forming a virtual pattern around the isolation pattern, in which a distance between the virtual pattern and the isolation pattern is y, and the virtual pattern has a pattern line width x.

Preferably, in the method described above, the distance y is larger than about 0.1 µm, a pattern line width x of the virtual pattern is in a range of about 0.5 µm to 10 cm, and a transparency of the virtual pattern is less than about 100%.

Accordingly, in the method described above, by forming the virtual pattern around the isolation pattern, the flare effect of the isolation pattern is close to that of the dense pattern. Thus the CD bias between a dense pattern and an isolation pattern is reduced, and the process windows of both patterns are not reduced.

In order to achieve the above objects and other advantages of the present invention, another method of reducing a CD bias between a dense pattern and an isolation pattern is provided. The method includes a first step of providing a mask, in which a portion of the mask has a dense pattern and another portion of the mask has an isolation pattern. The dense pattern has a first opaque pattern and the isolation pattern has a second opaque pattern, and another portion of the mask is transparent. A second step is that of forming an open area around the isolation pattern, and in the clear area, a distance between the opaque pattern and the isolation pattern is z.

Preferably, in the method described above, the distance z is in a range of about 0.1 µm to 10 cm, and a transparency of the clear area is larger than about 3%.

Accordingly, in the method described above, by forming the clear area around the isolation pattern, the flare effect of the isolation pattern is close to that of the dense pattern. Thus the CD bias between a dense pattern and an isolation pattern is reduced, and the process windows of both patterns are not reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
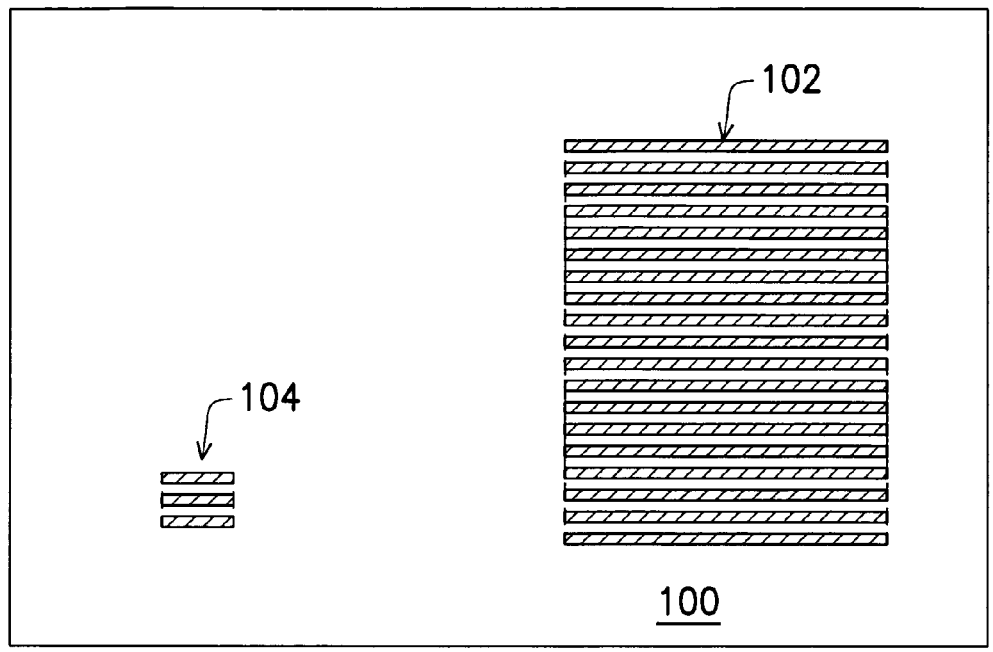
FIG. 1A illustrates a sketch of a conventional mask.
Figure 1B:
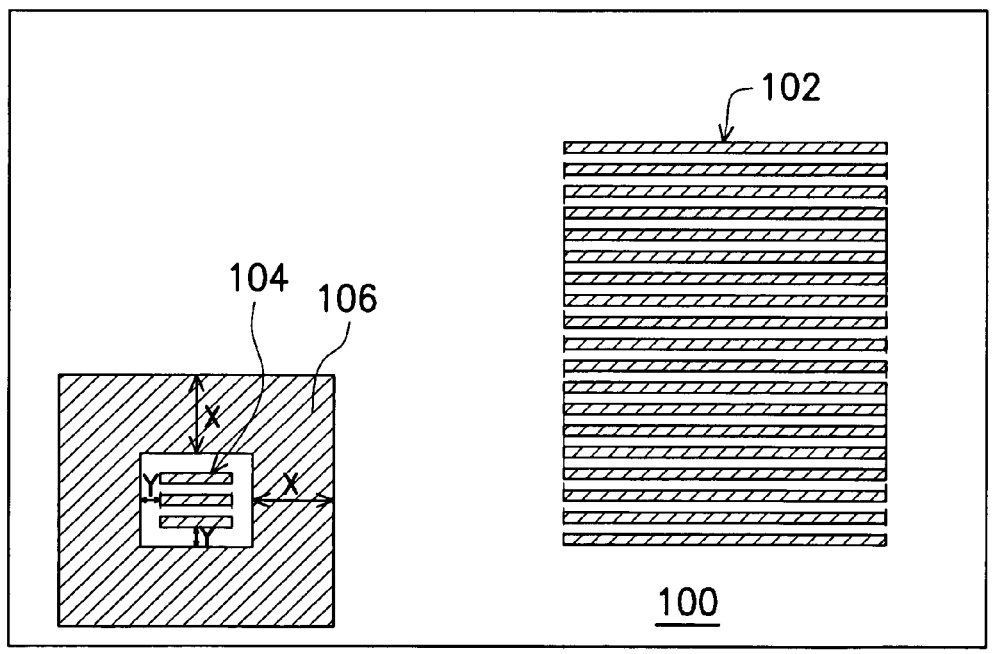
FIG. 1B illustrates a sketch of a mask of a preferred embodiment of the present invention.

FIG. 1A illustrates a sketch of a conventional mask, and FIG. 1B illustrates a sketch of a mask of a preferred embodiment of the present invention. Referring to FIG. 1A, a mask 100 is provided. A material of the mask 100 includes, but not limited to, a quartz glass. The mask 100 at least includes a portion of a dense pattern 102, another portion of an isolation pattern 104, and the other portion of the mask is transparent. The dense pattern 102 has a first opaque pattern and the isolation pattern 104 has a second opaque pattern. The dense pattern 102 is an area composed of a plurality of opaque films (the number of the opaque films is in a range of about 10 to about 100, and the number of that in FIG. 1A is 19). The isolation pattern 104 is another area composed of a plurality of opaque films (the number of the opaque films is in a range of about 1 to about 10, and the number of that in FIG. 1A is 3).

When the mask 100 of FIG. 1A is performed by an exposure process, if the CD of the exposed pattern of the dense pattern 102 has, for example but not limited to, a "line width/line space" value of about 0.38/0.2, then about 90% of the exposure energy for exposing the pattern is provided by a main light source, and about 10% of that is provided by a flare effect. When the same light source is provided for exposing the isolation pattern 104, the exposure energy provided by the flare effect is larger than about 10% because the area around the isolation pattern 104 is open and transparent, and thus the CD of the isolation pattern 104 may have a "line width/line space" value of about 0.35/0.23. Therefore the CD bias between a dense pattern and an isolation pattern is produced in the prior art.

Referring to FIG. 1B, in order to reduce the CD bias between a dense pattern and an isolation pattern, a preferred embodiment of the present invention provides a method of forming a virtual pattern 106 around the isolation pattern 104. The distance between the virtual pattern 106 and the isolation pattern 104 is y, and the virtual pattern 106 has a pattern line width x. In FIG. 1B, for example but not limited to, the distance y is larger than about 0.1 µm, the pattern line width x is in a range of about 0.5 µm to 10 cm, and a transparency of the virtual pattern 106 is less than about 100%.

When the mask 100 of FIG. 1B is performed by an exposure process, if the CD of the exposed pattern of the dense pattern 102 has, for example but not limited to, a "line width/line space" value of about also 0.38/0.2, then about 90% of the exposure energy for exposing the pattern is provided by a main light source, and about 10% of that is provided by a flare effect. When the same light source is provided for exposing the isolation pattern 104, the exposure energy provided by the flare effect is maintained at about 10% because the virtual pattern 106 is formed around the isolation pattern 104. Therefore the CD of a dense pattern can be the same as that of an isolation pattern in the embodiment of the present invention. And the exposure energy compensated by the flare effect can be adjusted by adjusting the transparency of the virtual pattern 106.

Accordingly, in the preferred embodiment described above, by forming the virtual pattern 106 around the isolation pattern 104, the flare effect of the isolation pattern 104 can be the same as that of the dense pattern 102. Thus the CD bias between a dense pattern and an isolation pattern is reduced, and the process windows of both patterns are not reduced.

Figure 2A:
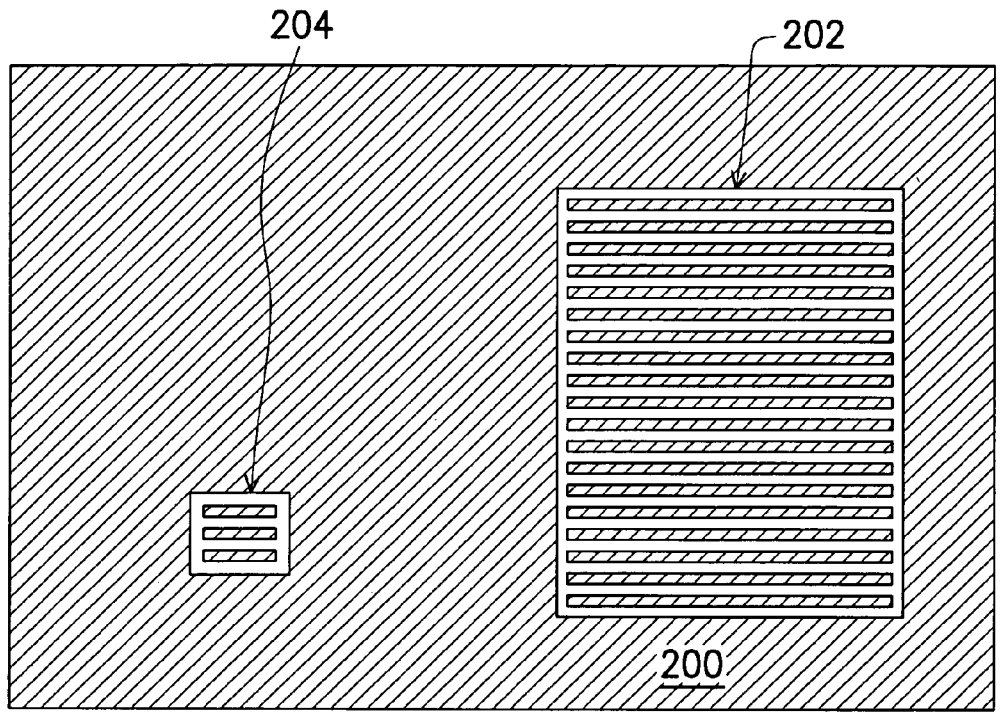
FIG. 2A illustrates a sketch of another conventional mask.
Figure 2B:
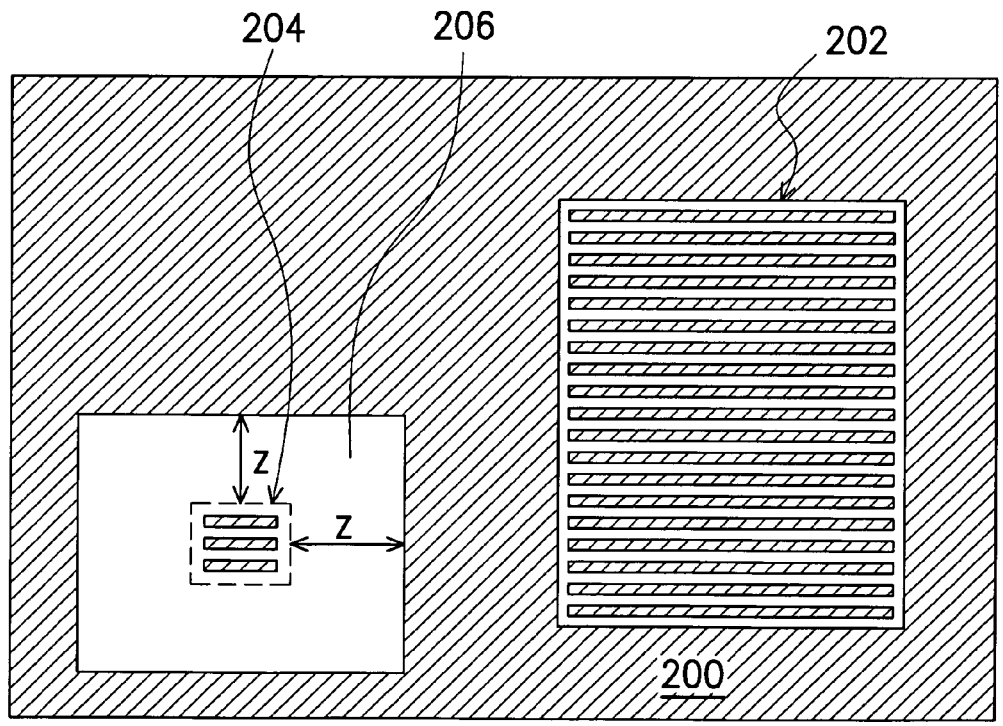
FIG. 2B illustrates a sketch of a mask of another preferred embodiment of the present invention.

FIG. 2A illustrates a sketch of another conventional mask, and FIG. 2B illustrates a sketch of a mask of another preferred embodiment of the present invention. Referring to FIG. 2A, a mask 200 is provided. A material of the mask 200 includes, but is not limited to, a quartz glass. The mask 200 at least includes a portion of a dense pattern 202, another portion of an isolation pattern 204, and the other portion of the mask is opaque. The dense pattern 202 has a first opaque pattern and the isolation pattern 204 has a second opaque pattern. The dense pattern 202 is an area composed of a plurality of opaque films (the number of the opaque films is in a range of about 10 to about 100, and the number of that in FIG. 2A is 19). The isolation pattern 204 is another area composed of a plurality of opaque films (the number of the opaque films is in a range of about 1 to about 10, and the number of that in FIG. 2A is 3).

When the mask 200 of FIG. 2A is performed by an exposure process, if the CD of the exposed pattern of the dense pattern 202 has, for example but not limited to, a "line width/line space" value of about 0.38/0.2, then about 90% of the exposure energy for exposing the pattern is provided by a main light source, and about 10% of that is provided by a flare effect. When the same light source is provided for exposing the isolation pattern 204, the exposure energy provided by the flare effect is less than about 10% because the area around the isolation pattern 204 is opaque, and thus the CD of the isolation pattern 204 may have a "line width/line space" value of about 0.42/0.16. Therefore the CD bias between a dense pattern and an isolation pattern is produced in the prior art.

Referring to FIG. 2B, in order to reduce the CD bias between a dense pattern and an isolation pattern, another preferred embodiment of the present invention provides a method of forming an open area 206 around the isolation pattern 204. In the clear area, a distance between the opaque pattern and the isolation pattern is z, the distance z is, for example but not limited to, a range of about 0.1 µm to 10 cm, and a transparency of the clear area is larger than about 3%.

When the mask 200 of FIG. 2B is performed by an exposure process, if the CD of the exposed pattern of the dense pattern 202 has, for example but not limited to, a "line width/line space" value of about also 0.38/0.2, then about 90% of the exposure energy for exposing the pattern is provided by a main light source, and about 10% of that is provided by a flare effect. When the same light source is provided for exposing the isolation pattern 204, the exposure energy provided by the flare effect is maintained at about 10% because the open area 206 is formed around the isolation pattern 204. Therefore the CD of a dense pattern can be the same as that of an isolation pattern in the embodiment of the present invention. And the exposure energy compensated by the flare effect can be adjusted by adjusting the transparency of the open area 206.

Accordingly, in the preferred embodiment described above, by forming the open area 206 around the isolation pattern 204, the flare effect of the isolation pattern 204 can be the same as that of the dense pattern 202. Thus the CD bias between a dense pattern and an isolation pattern is reduced, and the process windows of both patterns are not reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of reducing a critical dimension ("CD") bias between a dense pattern and an isolation pattern, comprising the steps:

providing a mask, wherein a portion of the mask has a dense pattern and another portion of the mask has an isolation pattern, wherein the dense pattern has a first opaque pattern and the isolation pattern has a second opaque pattern, wherein the other portion of the mask is transparent; and forming a virtual pattern around the isolation pattern, wherein a distance between the virtual pattern and the isolation pattern is y, and the virtual pattern has a pattern line width x, and wherein a transparency of the virtual pattern is adjusted to render an exposure energy due to a flare effect of the exposure of isolation pattern substantially the same as that due to a flare effect of the exposure of the dense pattern.

2. The method of reducing a CD bins between a dense pattern and an isolation pattern of claim 1, wherein the distance y is larger than about 0.1 µm.

3. The method of reducing a CD bias between a dense pattern and an isolation pattern of claim 1, wherein the pattern line width x is in a range of about 0.5 µm to 10 cm.

4. The method of reducing a CD bias between a dense pattern and an isolation pattern of claim 1, wherein the transparency of the virtual pattern is less than about 100%.

* * * * *